United States Patent [19]

Kato et al.

[11] Patent Number: 5,455,502
[45] Date of Patent: Oct. 3, 1995

[54] HIGH SPEED, LARGE-CURENT POWER CONTROL CIRCUIT

[75] Inventors: Katsuhisa Kato, Koshigaya; Toshihiko Onozawa, Koga, both of Japan

[73] Assignee: Sony/Tektronix Corporation, Tokyo, Japan

[21] Appl. No.: 301,936

[22] Filed: Sep. 7, 1994

[30] Foreign Application Priority Data

Sep. 14, 1993 [JP] Japan ..................... 5-252218

[51] Int. Cl.⁶ ................................. H01H 47/32
[52] U.S. Cl. .......................... 323/272; 361/153
[58] Field of Search .............. 323/272, 268–269, 323/272–273, 282, 316; 361/151–153

[56] References Cited

U.S. PATENT DOCUMENTS 5,099,383  3/1994  Fukano et al. ................... 323/272
5,285,148  2/1994  Uhlenhoff et al. ................ 323/272

*Primary Examiner*—Peter S. Wong
*Assistant Examiner*—Aditya Krishnan
*Attorney, Agent, or Firm*—Francis I. Gray

[57] ABSTRACT

A power control circuit for replacing a current limiting fuse in an electrical protection circuit or for switching large currents rapidly has an array of transistors, each having an identical characteristic to each other and to a device under test, to provide parallel current paths. All of the rows of the transistor array are biased "on" except for a predetermined row. A gate signal is generated to control the "on/off" state of the transistors in the predetermined row, the gate signal being a function of the presence of excessive current—holding the predetermined row of transistors biased "on" in normal operation, and turning the predetermined row of transistors "off" when excessive current is detected.

6 Claims, 3 Drawing Sheets

HIGH SPEED, LARGE-CURENT POWER CONTROL CIRCUIT

BACKGROUND OF THE INVENTION

The present invention relates to power control circuits, and more particularly to a power control circuit that is suitable for protecting an electric circuit from excessive current.

Generally a current limiting fuse is used to protect an electrical circuit and its associated system when an excessive current flows through the circuit due to, for example, a short circuit accident. The current limiting fuse prevents the circuit and its associated system from being damaged, since it cuts off the excessive current when it exceeds a rated current for the circuit and associated system. A typical circuit for testing the operational short-circuit limit characteristics of a device under test (DUT) is shown in FIG. 1. The device under test may be a semiconductor device operating with a large current, such as an insulated gate bipolar transistor (IGBT), a power metal oxide semiconductor field effect transistor (MOSFET) or the like. A signal source Ss provides a signal voltage to bias the device under test. A voltage meter Vm is coupled to measure the voltage across the device under test, and a current meter Im is coupled to measure the current through the device under test. A power source Vs provides a large voltage necessary for the excessive current test of the device under test. Since the large current may be provided in a short time interval, it may be generated by charging and discharging a capacitor, as is well known in the art. A protection circuit F that includes the current limiting fuse is coupled in series between the power source and the device under test to prevent an excessive current from flowing through the test circuit when the device under test breaks down. When the device under test breaks down, there is a large possibility that the current meter and the voltage source will be damaged due to the excessive current.

The semiconductor device, such as the IGBT, may operate with high speed and with a large current. A rapid fuse is used as part of the protection circuit for cutting off excessive current at high speed. However the rapid fuse is expensive and has to be exchanged after every execution of the short circuit test of the device under test. An especially large and expensive fuse is needed for large current high speed applications. Additionally the fuse has a finite amount of inductance which becomes a source of noise when a high frequency signal is applied to it.

What is desired is a high speed, large current power control circuit that is reusable, fast in response and relatively inexpensive for protecting electronic circuits and their associated systems.

SUMMARY OF THE INVENTION

Accordingly the present invention provides a power control circuit which controls the application of power to a load. The power control circuit has a transistor array with m rows and n columns formed by connecting m transistors in series and n sets of series transistors in parallel. A signal generator provides a gate signal to control the "on" or "off" state of the transistors in a predetermined row of the array. A bias generator maintains the transistors in the remaining rows, other than the predetermined row, in the "on" state. The signal generator detects a voltage or a current applied to the load, and changes the state of the gate signal to turn "off" the transistors in the predetermined row. Thus the power control circuit turns "off" in response to the output of the voltage or current detection so that electric power is cut off from the load when an excessive current condition is detected.

The objects, advantages and other novel features of the present invention are apparent from the following detailed description when read in conjunction with the appended claims and attached drawing.

DESCRIPTION OF THE PREFERRED EMBODIMENT

Figure 1:
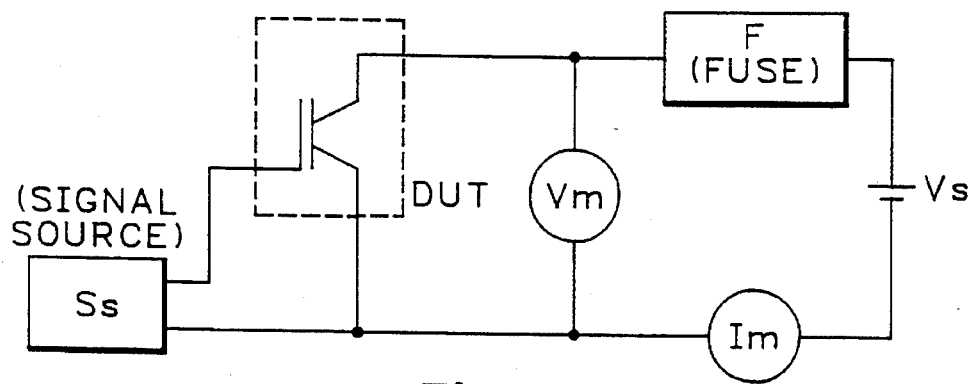
FIG. 1 is a block diagram view of a short circuit test circuit using a power control circuit according to the present invention.
Figure 2:
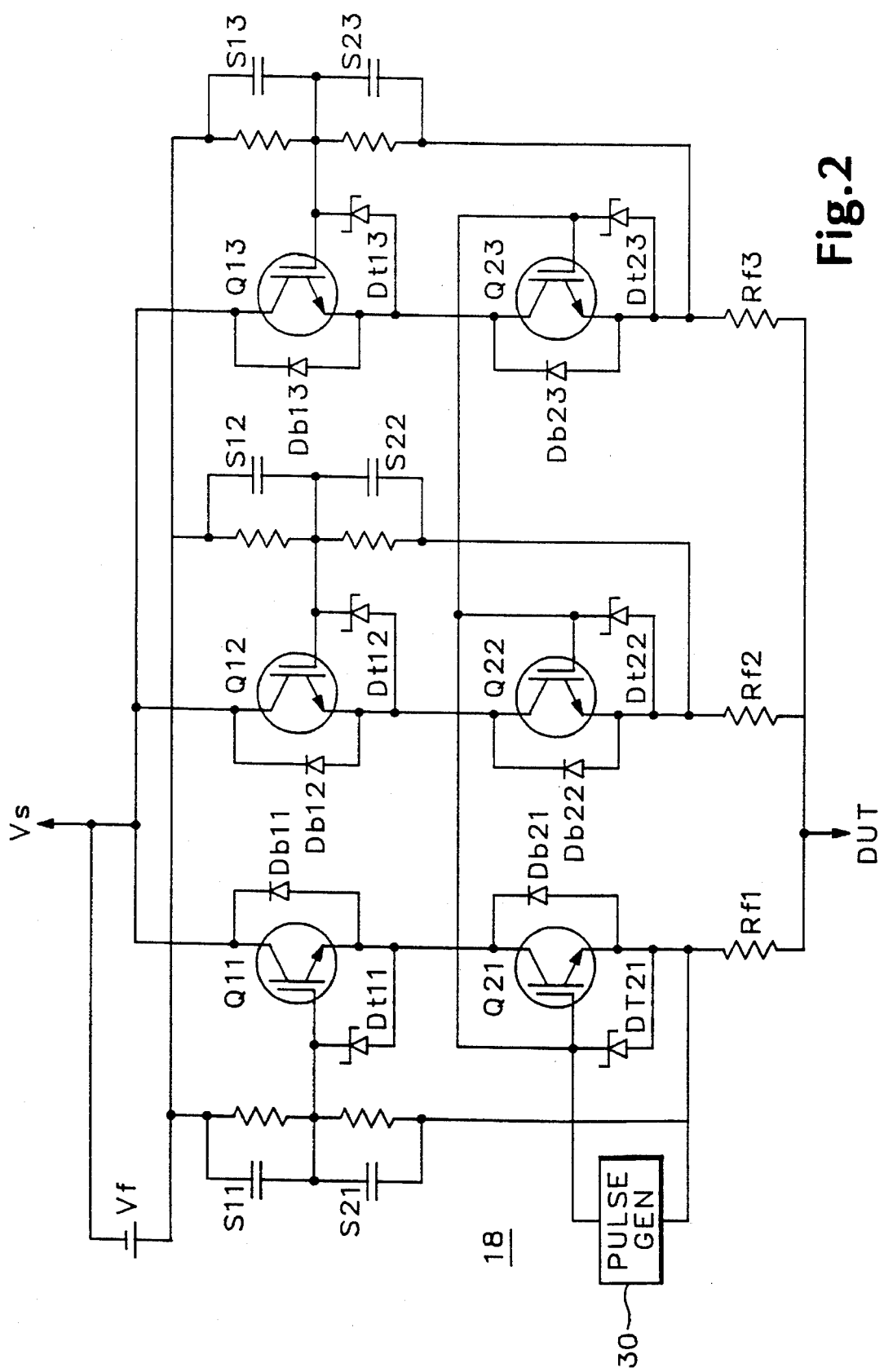
FIG. 2 is a schematic diagram view of a power control circuit according to the present invention.

Referring now to FIG. 2 a power control circuit 18 is shown having a plurality of switching devices, Q11–Q23, such as large current operating transistors including IGBTs and MOSFETs, connected in an array of m rows and n columns, where m and n are arbitrary integers. Each switching device Q11–Q23 has an identical characteristic and maximum voltage Vmax and current Imax parameters. For illustration purposes the circuit shown has two rows (m=2) and three columns (n=3). Referring back to FIG. 1 when a short-circuit test is started, the power source Vs is controlled to provide a desired amount of electrical power to the DUT. The protection circuit F, i.e., the power control circuit 18 described herein, is turned "on", as is described below, and the DUT also is turned "on" for measurement by the signal source Ss.

A floating power source Vf is connected between the collectors of the first row of transistors Q11–Q13 and n sets of voltage dividers S11–S23. The voltage dividers S11–S23 divide the floating voltage Vf, and apply the divided voltages to the respective gates of the first row transistors Q11–Q13 as bias voltages. The bias voltages assure that the transistors Q11–Q13 are kept in an "on" state. However at this point no current flows through the power control circuit 18. Respective diodes Db11–Db23 are connected between the emitters and collectors of the transistors Q11–Q23 to protect each transistor when reverse bias voltage is applied to them. The diodes Db11–Db23 act as current paths for current flowing from the floating power source Vf through the voltage dividers S11–S23. The voltage dividers S11–S23 may be resistive with parallel capacitors to improve the signal response characteristic. Respective Zener diodes Dt11–Dt23 are connected between the gate and emitter of each transistor Q11–Q23 to prevent the gate-emitter voltage from exceeding the rated voltage which would damage the transistors.

A pulse generator 30 generates a gate voltage signal that is applied across the gate-emitter junction of the first transistor Q21 in a predetermined row, i.e., the second row in this illustration. The gates of the remaining transistors Q22, Q23 in the predetermined row are connected together with the gate of the first transistor Q21. The emitters of the last transistor Q21–Q23 in each column are coupled through respective resistors Rf1–Rf3 to the device under test. When the gate voltage signal from the pulse generator 30 goes high, the first transistor Q21 in the predetermined row turns "on", and substantially simultaneously the remaining transistors Q22, Q23 in the row also turn "on". With the emitter resistors having equal resistances, the currents through each of the transistors Q11–Q23 are equal to each other. If the transistors in the power control circuit 18 are similar to the device under test, then a larger current than that rated for a single transistor may flow through the power control circuit without exceeding the ratings for any one transistor within the array, which would otherwise shorten the life of the transistors. Since the transistors Q11–Q13 in the first row are normally biased "on", the power control circuit 18 rapidly turns to an operating condition in response to the gate voltage signal.

Figure 3:
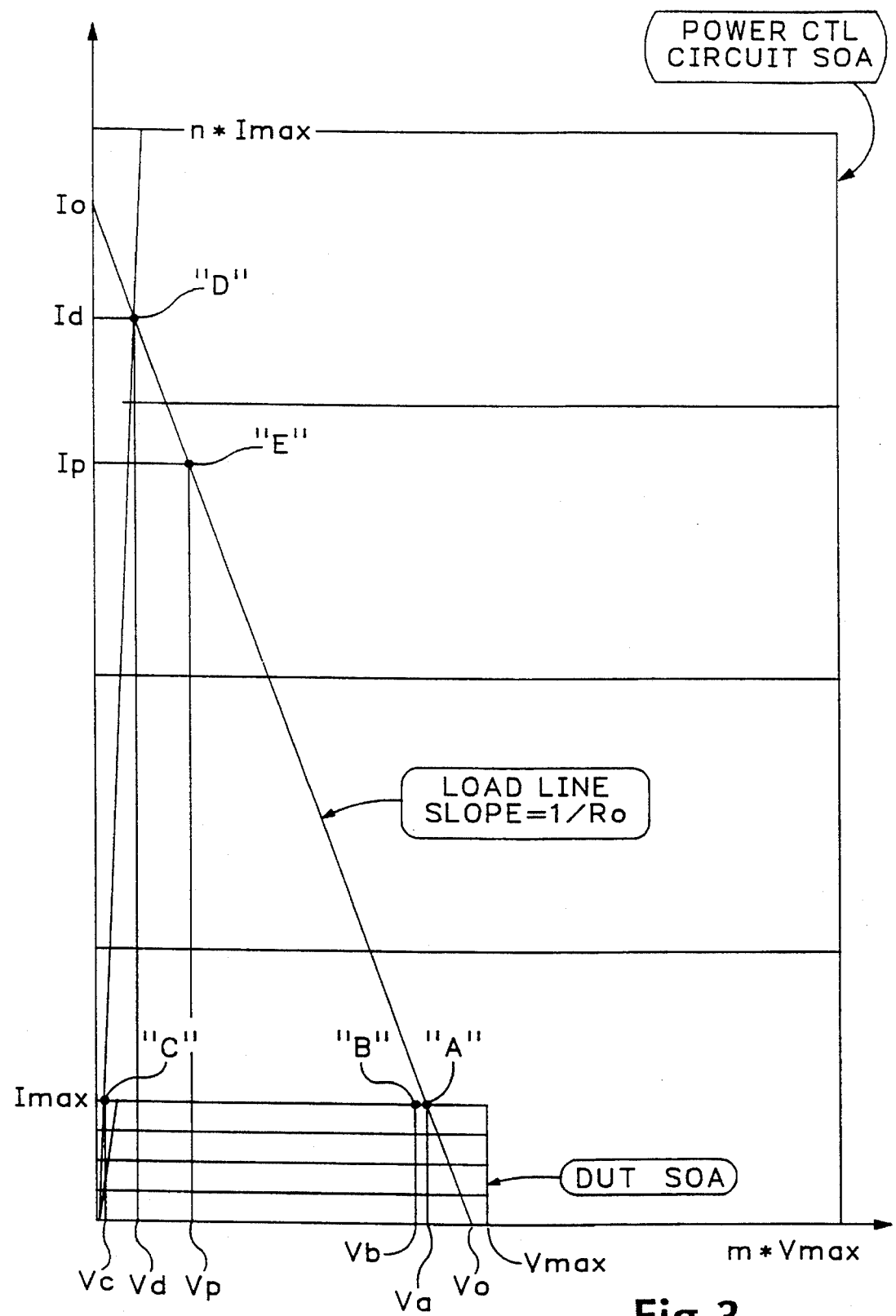
FIG. 3 is a graphical view representing a voltage-current characteristic of a power control circuit according to the present invention.

FIG. 3 shows a graph of the voltage-current characteristics of the test circuit including the power control circuit 18 and the device under test. A DUT safety operation area (SOA) is an area enclosed by lines corresponding to the maximum voltage Vmax and maximum current Imax for the device under test. A power control circuit SOA is an area enclosed by lines corresponding to the maximum voltage m*Vmax and maximum current n*Imax since the transistors Q11–Q23 have characteristics similar to that of the DUT. Increasing the number of transistors in a column (increasing the number of rows) increases the voltage of the SOA for the power control circuit 18, and increasing the number of columns of transistors increases the current of the SOA. When an output impedance of the power control circuit 18 is Ro and the voltage applied to the power control circuit is Vo, a load line of the power control circuit has a voltage axis intercept of Vo, a current axis intercept of Io (Io=Vo/Ro) and a slope of 1/Ro.

When electrical power from the source Vs is applied to the DUT connected in series with the power control circuit 18, an operating point exists in the area enclosed by the axes and the load line. Points B and C represent operating points of the DUT and the power control circuit 18. An intersection of the line corresponding to Imax and the load line is represented by point A. When voltages at the A, B, C points are represented by Va, Vb, Vc respectively, then Va=Vb+Vc.

When the DUT is short circuited during the short-circuit test, the impedance for the DUT becomes substantially zero. A current greater than Imax at point A flows through the shorted DUT and moves to an operating point D on the load line of the power control circuit 18. If the maximum current n*Imax of the power control circuit 18 is more than a short circuit current Id, the operating point D exists in the SOA of the power control circuit. If the short circuit current Id exceeds a predetermined cut-off current Ip, then the power control circuit 18 turns "off", disconnecting the voltage source Vs from the load DUT. This prevents a very large, excessive current from flowing through the current meter Im and the voltage source Vs.

Figure 4:
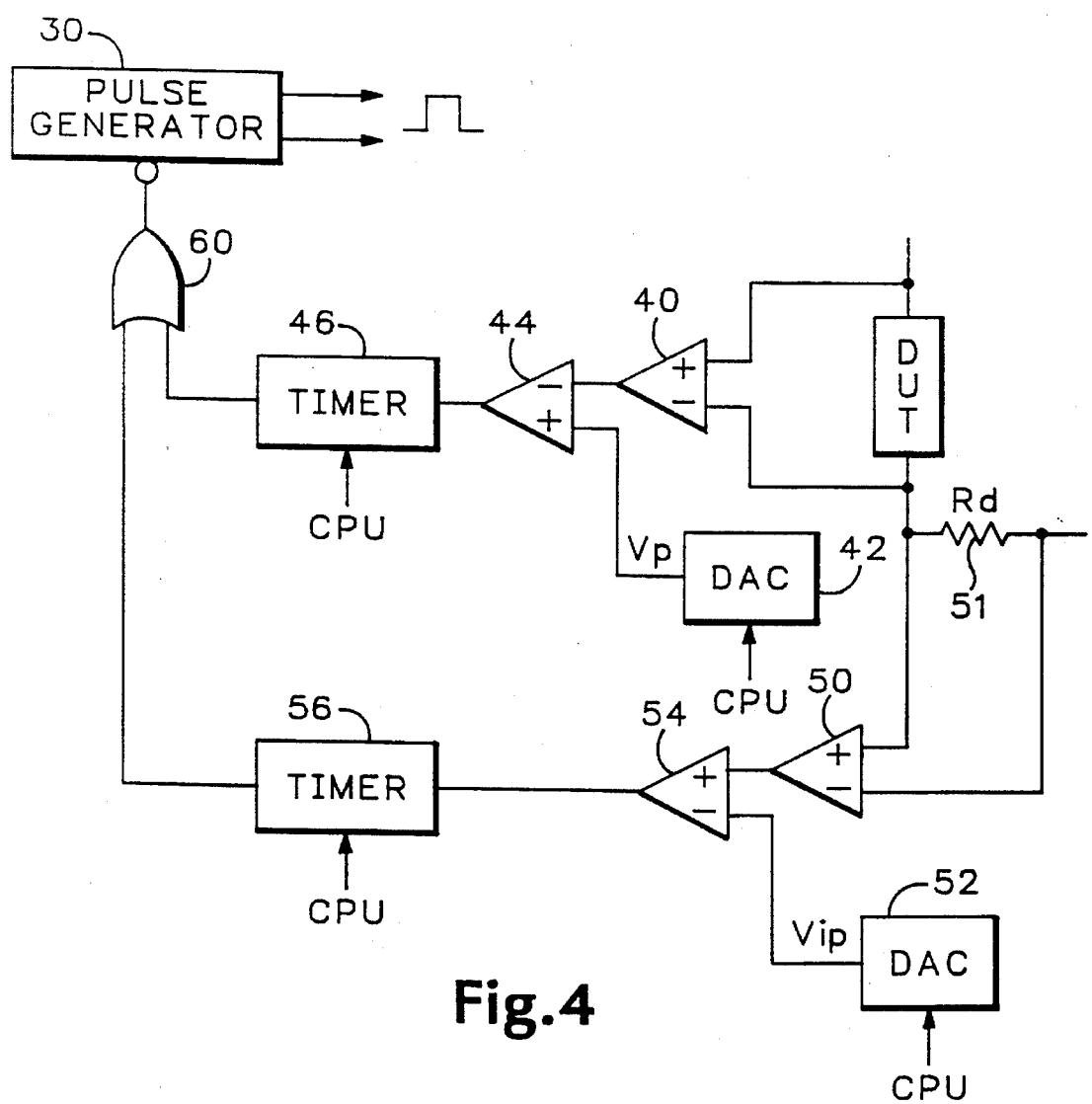
FIG. 4 is a block diagram view of a cut-off time control circuit for a power control circuit according to the present invention.

A conventional current limiting fuse has a variable cut-off time which is a function of the current or voltage applied to the load. The power control circuit 18 simulates the cut-off condition of the conventional current limiting fuse by enabling a variable cut-off time, i.e., the cut-off time is shorter for a large voltage value than for a small voltage value. A cut-off time control circuit 38 is shown in FIG. 4. A voltage drop across the DUT is detected by a voltage detection differential amplifier 40. A first digital to analog converter (DAC) 42 provides an output voltage Vp corresponding to an input digital data value from a central processing unit (CPU) (not shown). The voltage Vp is an arbitrary cut-off voltage which is set by an operator to a value less than Vmax, and a cut-off operation for the load current starts when the load voltage drops below Vp. A first comparator 44 provides an output pulse signal when the output voltage from the voltage detection differential amplifier 40 is lower than Vp. A first timer 46 counts a high frequency clock (not shown), as is well known in the art, during a first time period set by the CPU while the output pulse signal is high. At the completion of the first time period the timer 46 generates a carry signal which is input to an OR gate 60. The time period set in the first timer 46 is a function of the voltage Vp input to the DAC 42. In other words the set time period is short when Vp is high and long when Vp is low. The carry signal is not generated while the output pulse signal from the comparator 44 is shorter than the set time period. Therefore a very short duration of an excessive voltage or current applied to the power control circuit 18 is insufficient to cut-off the voltage source Vs from the load DUT, just as it is insufficient to cause a current limiting fuse to "fuse".

Likewise a current detection differential amplifier 50 detects a voltage across a current detection resistor Rd in series with the DUT indicative of the current through the load. The detected voltage is represented by Vd=I*Rd, where I is the current through the resistor. A second DAC 52 provides an output voltage Vip corresponding to a cut-off current Ip input by an operator via the CPU which is less than n*Imax. A second comparator 54 provides a pulse signal when a current larger than the cut-off current Ip flows through the load (DUT). A second timer 56 counts during a second time period set by the CPU in accordance with the value of the cut-off current Ip. The carry signal from the timer 56 also is provided to the OR gate 60. The output of the OR gate 60 is input to the pulse generator circuit 30.

The pulse generator 30 provides an output signal to the gates of the predetermined row of transistors Q21–Q23 to control whether the power control circuit 18 cuts off the current through the DUT, as described above. The pulse signal generated by either timer 46, 56 is applied from the OR gate 60 to the input of the pulse generator circuit 30. The gate signal from the pulse generator goes low in response to the pulse signal at the input, and then transistors Q21–Q23 are turned "off" to cut off the current through the DUT. The timing for cutting off the current may be adjusted in accordance with the time periods set in the timers 46, 56. Only one of the cut-off voltage and current detection circuits may used in a simplified embodiment. Also a plurality of cut-off voltages Vp or cut-off currents Ip and their preferred time periods for the timers 46, 56 corresponding to different types of fuses may be stored in a memory, such as a read only memory (ROM).

Although the present invention is described in conjunction with a circuit for short circuit testing, it may be used for other applications. For example when the DUT and the voltage source Vs are substituted with an inverter including a motor and a driving circuit for the motor, respectively, the power control circuit 18 serves to protect the circuit and associated system from an excessive current caused by sudden lock of the motor (lack of rotation) or short circuit in the electrical wiring. Further the power control circuit 18 may be used for rapidly switching a large current instead of being used as a protection circuit.

Thus the present invention provides a power control circuit for protecting electrical circuits from excessive currents or for switching large currents by using an array of switching devices, such as large current transistors, to form a plurality of current paths in parallel, the response to excessive current or the switching being rapid since only one row of the transistors in the array needs to be switched. Additionally the cut-off operation of current limiting fuses may be simulated by using a cut-off control circuit capable of setting a cut-off voltage and/or current and a corresponding cut-off time. Thus the power control circuit of the present invention may be used to operate an electrical circuit during testing in place of a fuse so that short circuit testing may be conducted safely without damage to the testing circuit.

What is claimed is:

1. A power control circuit for controlling the provision of electric power to a load comprising:

a switching device array having a first plurality of rows and a second plurality of columns formed by coupling switching devices in series, one from each row, to produce each column of switching devices in the array so that the columns provide a number of parallel current paths between a source voltage and the load;

means for generating a gate signal for controlling an "on" or "off" state simultaneously of each switching device in a predetermined row of the switching device array; and means for biasing the switching devices in rows, other than the predetermined row, in the "on" state.

2. The power control circuit as recited in claim 1 wherein the generating means comprises means for detecting whether a voltage applied to the load falls below a predetermined value to generate the gate signal to turn "off" the predetermined row of switching devices.

3. The power control circuit as recited in claim 1 wherein the generating means comprises means for detecting whether a current applied to the load exceeds a predetermined value to generate the gate signal to turn "off" the predetermined row of switching devices.

4. The power control circuit as recited in claim 1 wherein the load comprises a first transistor, and each switching device comprises a transistor having a characteristic identical to that of the first transistor.

5. The power control circuit as recited in claim 1 wherein each column of the switching device array includes a resistor coupled in series with the switching devices in the column, the resistors having identical resistances.

6. The power control circuit as recited in claim 5 wherein a control input for each switching device in the predetermined row is coupled to the control inputs of the other switching devices in the predetermined row, with the gate signal being applied between the control input and one side of one of the switching devices in the predetermined row.

* * * * *